(12) United States Patent
Bito (10) Patent No.: US 7,456,444 B2
(45) Date of Patent: Nov. 25, 2008

(54) FIELD EFFECT TRANSISTOR

(75) Inventor: Yasunori Bito, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 5 days.

(21) Appl. No.: 11/486,127

(22) Filed: Jul. 14, 2006

(65) Prior Publication Data

US 2007/0045663 A1 Mar. 1, 2007

(30) Foreign Application Priority Data

Jul. 21, 2005 (JP) .............................. 2005-210801

(51) Int. Cl.
*H01L 21/338* (2006.01)

(52) U.S. Cl. .................. 257/194; 257/195; 257/192; 257/280

(58) Field of Classification Search ................ 257/192, 257/194, 195, 201, 284, 615, 745
See application file for complete search history.

(56) References Cited

U.S. PATENT DOCUMENTS

| | | | | |
|---|---|---|---|---|
| 5,504,353 A | * | 4/1996 | Kuzuhara | ................. 257/194 |
| 5,739,558 A | * | 4/1998 | Ishida et al. | ................. 257/192 |
| 5,923,951 A | * | 7/1999 | Goossen et al. | ............... 438/47 |
| 5,952,672 A | * | 9/1999 | Kikkawa | ..................... 257/15 |
| 6,025,613 A | * | 2/2000 | Bito et al. | .................... 257/192 |
| 6,207,976 B1 | * | 3/2001 | Takahashi et al. | ........... 257/192 |
| 6,605,831 B1 | * | 8/2003 | Inai et al. | ..................... 257/194 |
| 6,624,440 B2 | * | 9/2003 | Bito et al. | ..................... 257/20 |
| 6,936,870 B2 | * | 8/2005 | Nishihori et al. | ............ 257/194 |
| 2001/0019131 A1 | * | 9/2001 | Kato et al. | .................... 257/76 |
| 2004/0104404 A1 | * | 6/2004 | Bito | .......................... 257/192 |

FOREIGN PATENT DOCUMENTS

JP 2001-250939 9/2001

* cited by examiner

*Primary Examiner*—Zandra Smith
*Assistant Examiner*—Telly D Green
(74) *Attorney, Agent, or Firm*—McGinn IP Law Group, PLLC (57) ABSTRACT

A field effect transistor according to an embodiment of the invention includes: a semiconductor substrate; a channel layer of a first conductivity type formed on the semiconductor substrate; and a semiconductor layer of a second conductivity type that is buried in a recess structure formed in a semiconductor layer on the channel layer and connected with a gate electrode, in which the recess structure is formed using a recess stopper layer containing In, a semiconductor layer that contacts the bottom of the semiconductor layer of the second conductivity type does not contain In, and the uppermost semiconductor layer among semiconductor layers that contact a side surface of the semiconductor layer of the second conductivity type does not contain In.

20 Claims, 7 Drawing Sheets

FIELD EFFECT TRANSISTOR

BACKGROUND OF THE INVENTION

1. Field of the Invention

The present invention relates to a field effect transistor. In particular, the invention relates to a junction gate field effect transistor with a high gate forward turn-on voltage, a large maximum drain current, and a low on-resistance.

2. Description of Related Art

A hetero-junction field effect transistor (FET: Field Effect Transistor) made of a III-V compound semiconductor, which is typified by HEMT (High electron mobility transistor), has been widely used as a low-noise, high-power, and high-efficiency device. Among transistors made of III-V compound semiconductor, GaAs or InP-made electronic devices are promising as ultrahigh-speed and high-frequency devices.

In order to enhance the performance of the field effect transistor made of the III-V compound semiconductor, a gate forward turn-on voltage ($V_F$) needs to be increased. This is because an increase in $V_F$ leads to a higher gate voltage, so the maximum drain current that flows through the FET can be increased. Further, the increase in $V_F$ also leads to a decrease in leak current as a current amount at null voltage.

To increase the voltage $V_F$, it is necessary to form a potential barrier as an electron barrier just below the gate such that no leak current flows even if a high voltage is applied to the gate electrode. If the potential barrier is small, the leak current flows at the time of applying the high voltage to the gate electrode, so an effective voltage applied to the gate electrode is lowered. Thus, the voltage $V_F$ cannot be increased.

A pn junction formed just below the gate electrode is utilized for forming the potential barrier below the gate. The pn junction enables a higher potential than a Schottky barrier resulting from the contact between metal and semiconductor. Therefore, it is conceivable that the $V_F$ can be increased by forming the pn junction just below the gate electrode of the FET.

To that end, there has been proposed an FET that is constructed to have the pn junction just below the gate electrode of the FET for increasing the voltage $V_F$. As an example of the structure where the pn junction is defined just below the gate electrode, there has been known an FET where a gate recess structure is formed just below the gate electrode, and a p$^+$-GaAs layer is formed in the gate recess structure (see Japanese Unexamined Patent Application Publication No. 2001-250939, for example).

In this FET, the p$^+$ type semiconductor layer is buried into the gate recess structure, and the pn junction interface is defined closer to the substrate. Hence, a distance between the pn junction interface and the channel is reduced, so a threshold voltage is turned into a positive voltage (enhancement type), and the on-resistance can be reduced due to less influence of a surface depletion layer formed in the semiconductor layer adjacent to the gate electrode to the channel layer.

Further, in order to obtain the gate recess structure, an InGaP stopper layer formed below the gate recess structure is utilized. The reason why an InGaP layer is used as the stopper layer is that the barrier height of the InGaP layer in a conduction band is small, so a resistance of a current path from an ohmic electrode to the channel is lowered and thus, the on-resistance can be reduced.

Figure 12:
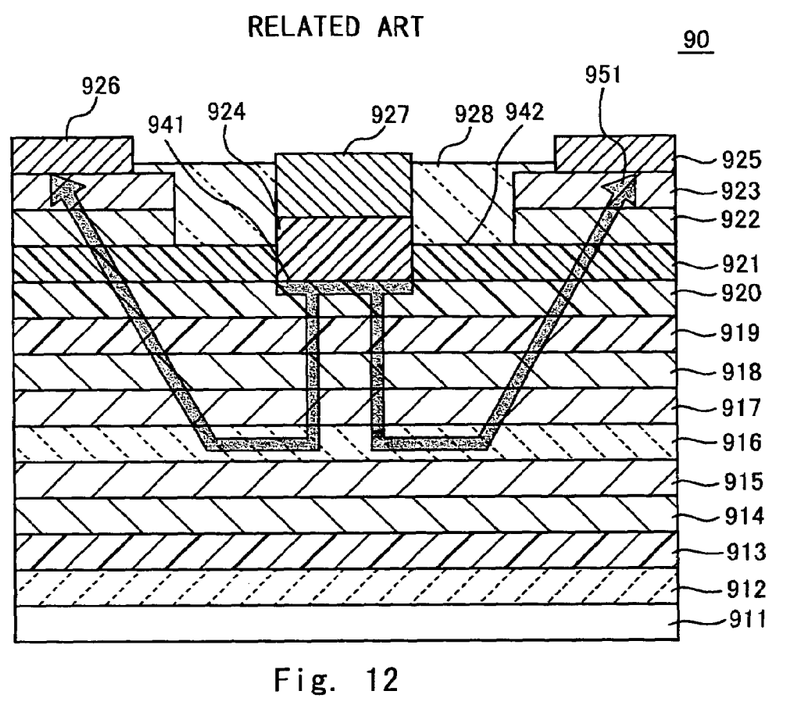
FIG. 12 is a sectional view of the J-FET of the Related Art.

FIG. 12 is a sectional view of a J-FET (Junction FET) 90 of the Related Art. Laminated on a GaAs substrate 911, an undoped GaAs layer 912, an undoped AlGaAs layer 913, an Si doped AlGaAs electron supply layer 914, an undoped AlGaAs spacer layer 915, an undoped InGaAs channel layer 916, an undoped AlGaAs spacer layer 917, an Si doped AlGaAs electron supply layer 918, an undoped AlGaAs layer 919, and an undoped InGaP gate recess stopper layer 920.

An undoped GaAs layer 921 is laminated on the undoped InGaP gate recess stopper layer 920. In the undoped GaAs layer 921, a gate recess structure 941 is formed. A C-doped p$^+$-GaAs layer 924 is buried into the gate recess structure 941. The C-doped p$^+$-GaAs layer 924 forms the pn junction. In addition, a gate electrode 927 is laminated on the C-doped p$^+$-GaAs layer 924.

In addition, an Si doped AlGaAs wide recess stopper layer 922 and an Si doped GaAs cap layer 923 are layered on the undoped GaAs layer 921. A wide recess structure 942 is formed in the wide recess stopper layer 922 and the cap layer 923. A gate insulating film 928 is formed in the wide recess structure 942. Further, a drain electrode 925, and a source electrode 926 is formed on the Si doped GaAs cap layer 923.

However, in the J-FET 90 of the Related Art, when the p$^+$-GaAs layer 924 grows in the gate recess structure 941, In of the undoped InGaP gate recess stopper layer 920 that contacts the bottom of the p$^+$-GaAs layer 924 reacts with AsH$_3$ as a material gas of the p$^+$-GaAs layer 924 to form the InAs semiconductor layer. A band gap of this InAs semiconductor layer is smaller than the GaAs layer, AlGaAs layer and the InGaP layer, and its potential barrier with respect to electrons is low. Thus, recombination easily occurs in the InAs layer, and a recombination current flows.

Moreover, at the surface of the undoped InGaP gate recess stopper layer 920, an indium oxide layer such as In$_2$O$_3$ that is generated through the reaction between In extracted from this layer and oxygen is formed at the interface between the undoped InGaP gate recess stopper layer 920 and the p$^+$-GaAs layer 924. The indium oxide has conductivity.

Based on the above, as shown in FIG. 12, a gate leak current 951 flows from the gate to a source or a drain through the aforementioned indium oxide or InAs semiconductor layer. A semiconductor layer positioned just below portions other than the recess structure of the wide recess structure, a depletion layer is formed up to the undoped InGaAs channel layer 916 due to a surface potential, so the gate leak current 951 flows from the p$^+$-GaAs layer 924 to the undoped InGaAs channel layer 916, flows through a path similar to a drain current path, and flows into the drain electrode 925, and the source electrode 926. As a result, the gate forward turn-on voltage $V_F$ is decreased.

Figure 13:
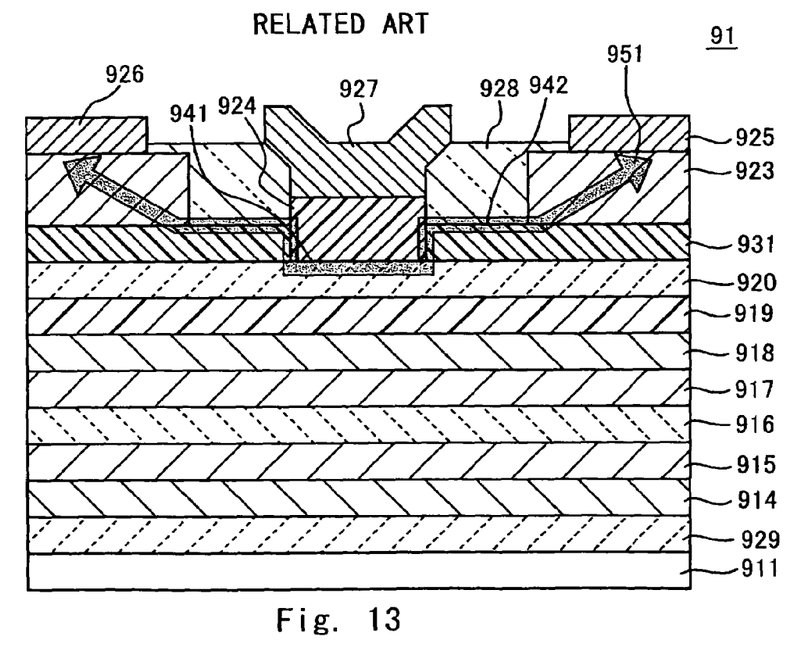
FIG. 13 is a sectional view of a J-FET of the Related Art.

As another example of the Related Art, there is proposed a J-FET 91 that is formed using an InGaP stopper layer adjacent to the gate recess structure for forming the gate recess structure just below the gate electrode (see "Applied Physics Letters", 1980, Vol. 37, pp. 163-165, for example. FIG. 13 is a sectional view of the J-FET 91 of the Related Art.

In the J-FET 91 of the Related Art, the gate recess structure 941 is obtained using the InGaP gate recess stopper layer 931 adjacent to the gate recess structure 941. In the J-FET 91, a side surface of the p$^+$-GaAs layer 924 just below the gate electrode only contacts the InGaP gate recess stopper layer 931.

However, in the J-FET 91 structure as well, when the p$^+$-GaAs layer 924 is formed just below the gate electrode such that the side surface thereof contacts the InGaP gate recess stopper layer 931, the indium oxide or InAs semiconductor layer is formed on the surface of the InGaP gate recess stopper layer 931. The gate leak current 951 flows through the indium oxide or InAs semiconductor layer formed on the surface of the InGaP gate recess stopper layer 931.

As mentioned above, at the time of forming the semiconductor layer that forms the pn junction just below the gate electrode, if the semiconductor layer containing In is used as the stopper layer, a gate leak current flows, making it impossible to increase the gate forward turn-on voltage $V_F$.

SUMMARY OF THE INVENTION

A field effect transistor according to an aspect of the invention includes: a semiconductor substrate; a channel layer of a first conductivity type formed on the semiconductor substrate; and a semiconductor layer of a second conductivity type that is buried in a recess structure formed in a semiconductor layer on the channel layer and connected with a gate electrode, in which the recess structure is formed using a recess stopper layer containing In, a semiconductor layer that contacts the bottom of the semiconductor layer of the second conductivity type does not contain In, and the uppermost semiconductor layer among semiconductor layers that contact a side surface of the semiconductor layer of the second conductivity type does not contain In.

According to the J-FET of the present invention, it is possible to suppress a leak current that flows through the conductive indium oxide formed on InGaP or InAs semiconductor with a small band gap. Hence, the J-FET having a high gate forward turn-on voltage can be obtained. Consequently, the J-FET can increase the maximum drain current.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
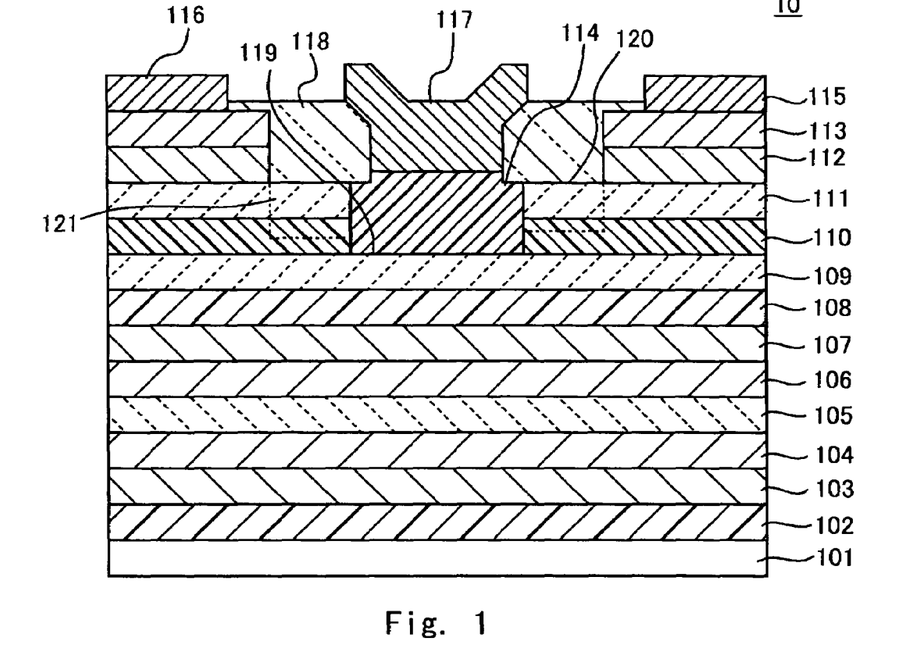
FIG. 1 is a sectional view of a J-FET according to an embodiment of the present invention.

Hereinafter, an embodiment of the present invention is described in detail with reference to the accompanying drawings. A J-FET (Junction Field Effect Transistor) 10 of this embodiment has a feature that a gate opening of two layers of an undoped InGaP gate recess stopper layer 110 and an undoped GaAs layer 111 is etched and removed to form a gate recess structure 119, and a C-doped p$^+$-GaAs layer 114 is buried into the gate recess structure, and then the C-doped p$^+$-GaAs layer 114 contacts two layers of the undoped InGaP gate recess stopper layer 110 and the undoped GaAs layer 111, and the p$^+$-GaAs layer 114 at the side surface of the gate recess structure 119.

FIG. 1 is a sectional view of the J-FET 10 of this embodiment. In the FET of this embodiment, laminated on a semi-insulative GaAs substrate 101, an undoped AlGaAs buffer layer 102 (for example, with the thickness of 500 nm), an n$^+$-AlGaAs electron supply layer 103 (for example, with the thickness of 4 nm), an undoped AlGaAs spacer layer 104 (for example, with the thickness of 2 nm), an undoped InGaAs channel layer 105 (for example, with the thickness of 15 nm), an undoped AlGaAs spacer layer 106 (for example, with the thickness of 2 nm), an n$^+$-AlGaAs electron supply layer 107 (for example, with the thickness of 4 nm), an undoped AlGaAs layer 108 (for example, with the thickness of 5 nm), and an undoped GaAs layer 109 (for example, with the thickness of 5 nm).

The buffer layer 102 is used for suppressing an influence of impurities accumulated at the interface between the GaAs substrate 101 and the semiconductor layer formed above the GaAs substrate. Further, a channel layer 105 is interposed between two layers of the n$^+$-AlGaAs electron supply layer 103 and the n$^+$-AlGaAs electron supply layer 107, so electrons can be supplied to the undoped InGaAs channel layer 105 at high density. Thus, the n$^+$-AlGaAs electron supply layer 103 and the n$^+$-AlGaAs electron supply layer 107 are doped with Si impurities, for example at $3 \times 10^{18}$ cm$^{-3}$.

In the J-FET, a drain current that flows through the undoped InGaAs channel layer 105 is controlled using a gate voltage. This control is applied based on the side of a depletion layer extending in the undoped InGaAs channel layer 105. Further, the undoped InGaAs channel layer 105 may be an undoped GaAs layer, not the undoped InGaAs layer.

Laminated on the undoped GaAs layer 109 are the undoped InGaP gate recess stopper layer 110 (for example, with the thickness of 5 nm), and the undoped GaAs layer 111 (for example, with the thickness of 15 nm). In the J-FET 10 of this embodiment, the gate recess structure 119 is formed in the undoped InGaP gate recess stopper layer 110 and the undoped GaAs layer 111.

In the J-FET 10 of this embodiment, the undoped GaAs layer 111 may be an undoped AlGaAs layer. Further, the undoped GaAs layer 109, the undoped InGaP gate recess stopper layer 110, and the undoped GaAs layer 111 may contain n-type impurities or p-type impurities.

As an example thereof, the undoped GaAs layer 109 may be doped as C impurities at $1\times10^{16}$ cm$^{-3}$ into a p$^-$-GaAs layer. The undoped InGaP gate recess stopper layer 110 may be doped with Si impurities at $5\times10^{17}$ cm$^{-3}$ into an n-InGaP layer. The undoped GaAs layer 111 may be doped with Si impurities at $5\times10^{17}$ cm$^{-3}$ into an n-GaAs layer.

The undoped InGaP gate recess stopper layer 110 is a semiconductor layer that is not etched with an etchant used for forming the gate recess structure. Accordingly, the semiconductor layer up to the undoped GaAs layer 111 on the undoped InGaP gate recess stopper layer 110 may be selectively etched.

With this etching, a recess is formed in the undoped GaAs layer 111, after which the undoped GaAs layer 111 having the recess is used as a mask to form a recess in the undoped InGaP gate recess stopper layer 110, making it possible to obtain the gate recess structure 119.

Based on the above, the thickness of the undoped InGaP gate recess stopper layer 110 is preferably 1 nm or more. This is to prevent the undoped GaAs layer 111 from being etched up to the undoped InGaP gate recess stopper layer 110 upon etching the undoped GaAs layer 111 with the undoped InGaP gate recess stopper layer 110 being used as a stopper layer.

Further, the In composition of the undoped InGaP gate recess stopper layer 110 is desirably $0.4 \leq x \leq 0.6$. This value is set in consideration of lattice matching with the GaAs substrate 101. In this embodiment, layers other than the undoped InGaP gate recess stopper layer 110 are based on the GaAs layer, for example, an AlGaAs layer, an InGaAs layer, and a GaAs layer, so lattice matching would be easily attained. Thus, only the undoped InGaP gate recess stopper layer 110 needs to be controlled based on the In composition.

Further, in the gate recess stopper layer 110, a In-contained semiconductor $(Al_xGa_{1-x})_yIn_{1-y}P$ ($0.4 \leq y \leq 0.6$) that matches in lattice with the GaAs substrate 101 can be used in place of the InGaP layer. This is because, similar to $In_xGa_{1-x}P$ ($0.4 \leq x \leq 0.6$), it is easy to attain lattice matching with the GaAs substrate 101 and control a resistance value.

Figure 2:
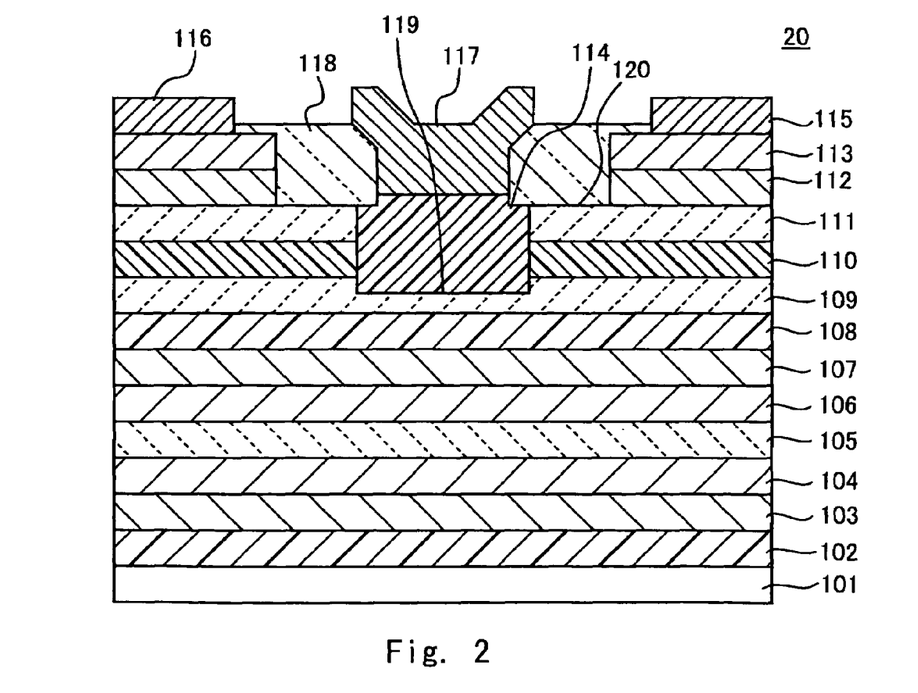
FIG. 2 is a sectional view of a J-FET having such a structure that a gate recess structure is formed in an undoped GaAs layer.
Figure 3:
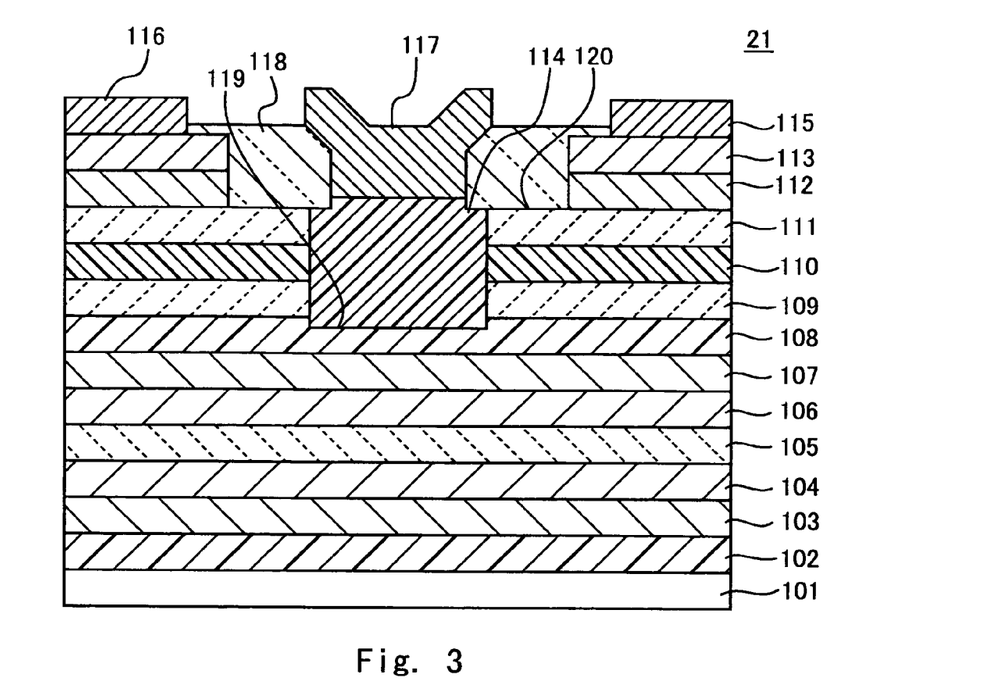
FIG. 3 is a sectional view of a J-FET having a structure where the gate recess structure extends through an undoped GaAs layer to form a recess portion in an undoped AlGaAs layer.

Incidentally, as shown in FIG. 2, a J-FET 20 structured such that the gate recess structure 119 is formed in the undoped GaAs layer 109 may be used. Further, as shown in FIG. 3, a J-FET 21 having a recess formed in such a way that the gate recess structure 119 is formed in the undoped AlGaAs layer 108 through the undoped GaAs layer 109 may be used.

Figure 4:
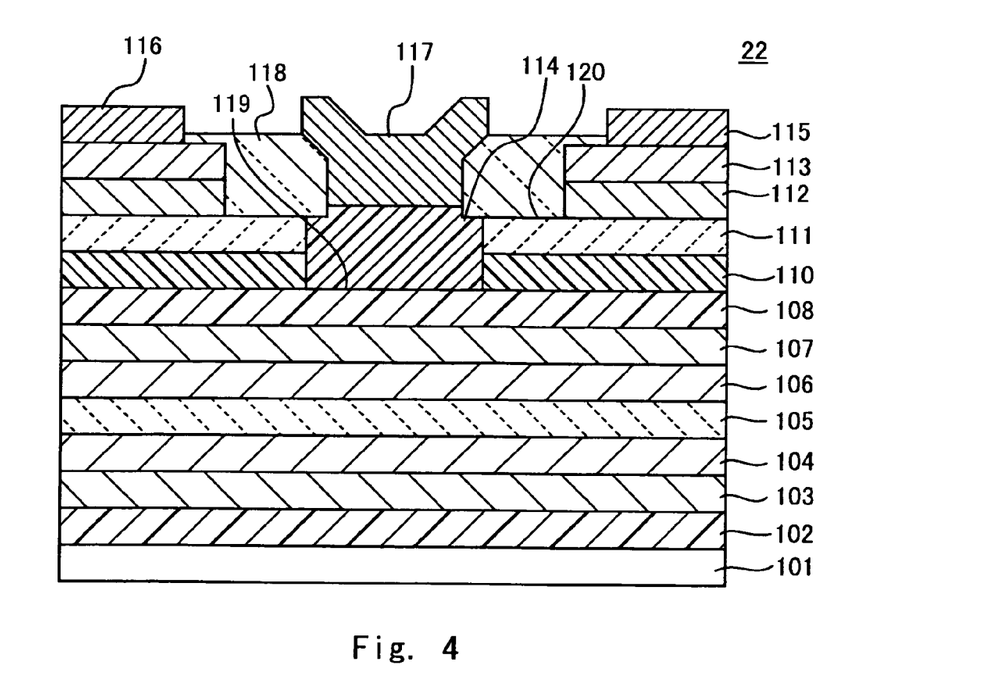
FIG. 4 is a sectional view of a J-FET 22 having a structure where an undoped GaAs layer is not laminated, and a gate recess structure is formed above the undoped AlGaAs layer and a p$^+$-GaAs layer is buried thereinto.

In addition, it is possible to use a J-FET 22 structured such that, instead of forming the gate recess structure 119 above the undoped GaAs layer 109 and burying the p$^+$-GaAs layer 114 in the structure, as shown in FIG. 4, the undoped GaAs layer 109 is not laminated, and the gate recess structure 119 is formed above the undoped AlGaAs layer 108 and then the p$^+$-GaAs layer 114 is buried into the structure.

Figure 5:
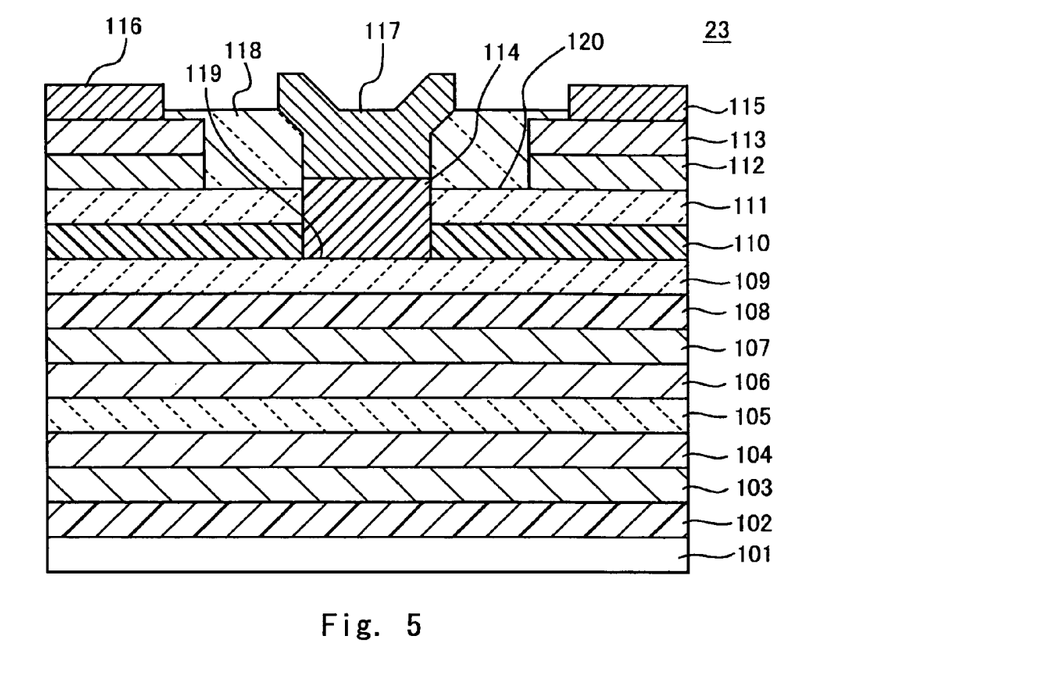
FIG. 5 is a sectional view of a J-FET with a narrower gate recess structure.

Further, as shown in FIG. 5, it is possible to use a J-FET 23 structured such that the width of the gate recess structure 119 is reduced by shortening an etching period to change a side etching amount.

Figure 6:
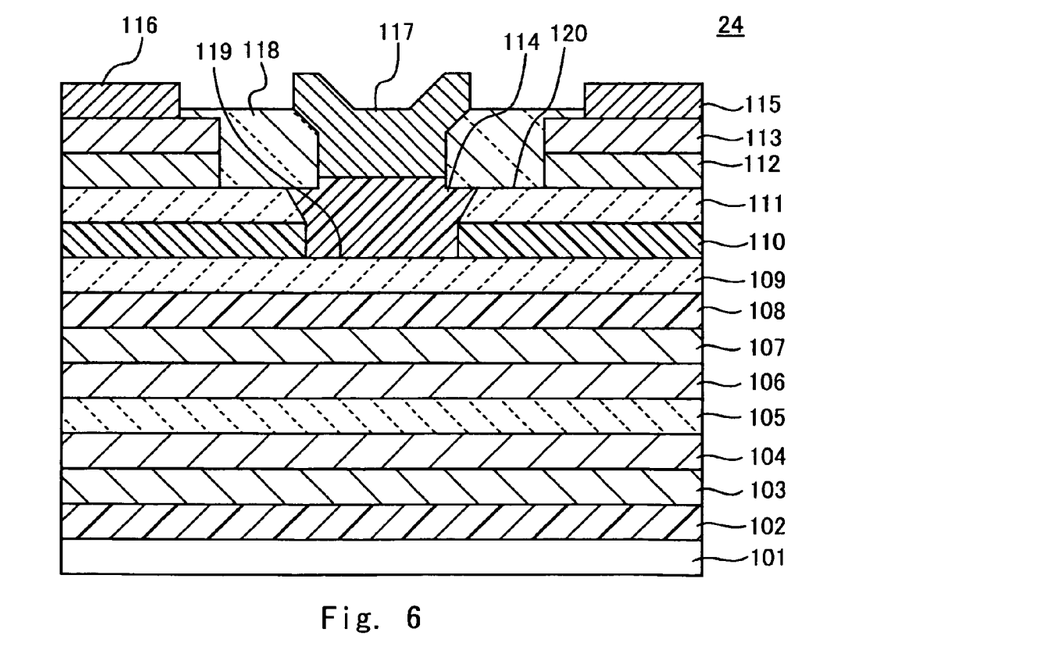
FIG. 6 is a sectional view of a J-FET having a structure where an opening of an upper side of a p$^+$-GaAs layer is wider than that of the bottom of the p$^+$-GaAs layer.
Figure 7:
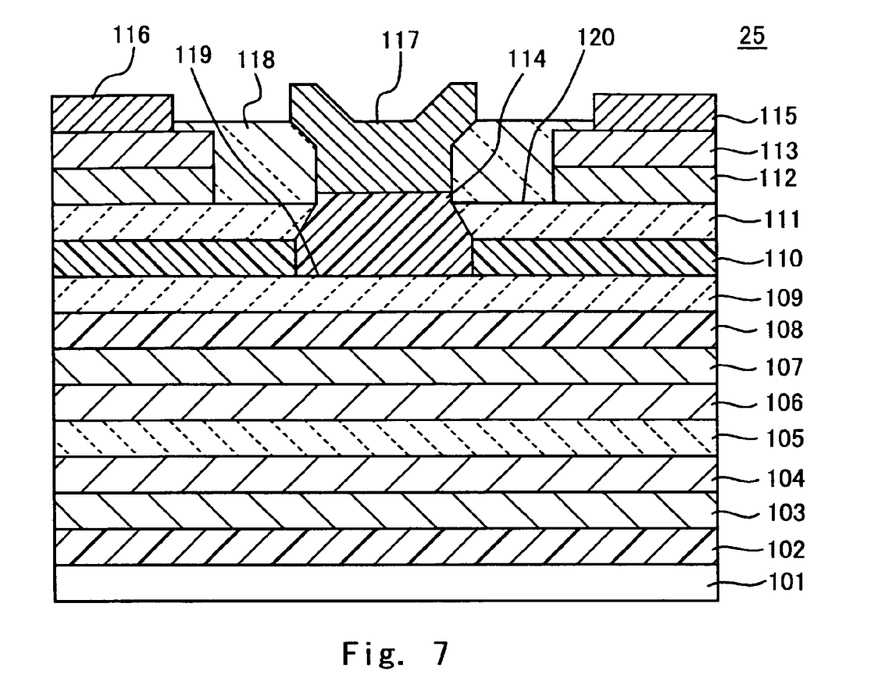
FIG. 7 is a sectional view of a J-FET having a structure where an opening of an upper side of a p$^+$-GaAs layer is narrower than that of the bottom of the p$^+$-GaAs layer.

Further, the undoped GaAs layer 111 may be side-etched into various shapes (see FIGS. 6 and 7). As shown in FIG. 6, a J-FET 24 structured such that an opening of the bottom of the p$^+$-GaAs layer 114 is narrower than an opening of the upper side thereof is formed through etching the undoped GaAs layer 111 with a citric acid etchant. Subsequent etching of the undoped InGaP gate recess stopper layer 110 is InGaP etching with hydrochloric acid, so the opening width at the bottom is substantially equal to that of the upper side.

Furthermore, as shown in FIG. 7, similar beneficial effects are attained by use of a J-FET 25 structured such that an opening at the bottom of the a p$^+$-GaAs layer 114 is wider than an opening of the upper side thereof.

In the thus structured gate recess structure 119, the p$^+$-GaAs layer 114 (for example, with the thickness of 80 nm) is buried. In this case, the p$^+$-GaAs layer 114, the undoped GaAs layer 109, and the undoped InGaP gate recess stopper layer 110 come into contact at the side surface of the gate recess structure 119.

Further, in the J-FET 10 of this embodiment, the thickness of the p$^+$-GaAs layer 114 is thicker than the total thickness of the undoped GaAs layer 109 and the undoped InGaP gate recess stopper layer 110.

This is because, if the thickness of the p$^+$-GaAs layer 114 is thinner than the total thickness of the undoped GaAs layer 109 and the undoped InGaP gate recess stopper layer 110, the gate electrode 117 comes into direct contact with the undoped GaAs layer 109, so an effective voltage applied to the pn junction would be reduced.

In the J-FET 10 of this embodiment, the p$^+$-GaAs layer 114 is buried into the gate recess structure 119 to form a pn junction, so a surface depletion layer 121 is formed near the p$^+$-GaAs layer 114 in the undoped GaAs layer 109 and the undoped InGaP gate recess stopper layer 110.

The surface depletion layer 121 is far from the InGaAs channel layer 105, so the density of electrons accumulated in the InGaAs channel layer 105 increases. Thus, a sheet resistance of the InGaAs channel layer 105 is lowered to attain a high mutual conductance (500 mS/mm) and low on-resistance (1.6 Ωmm).

Figure 8:
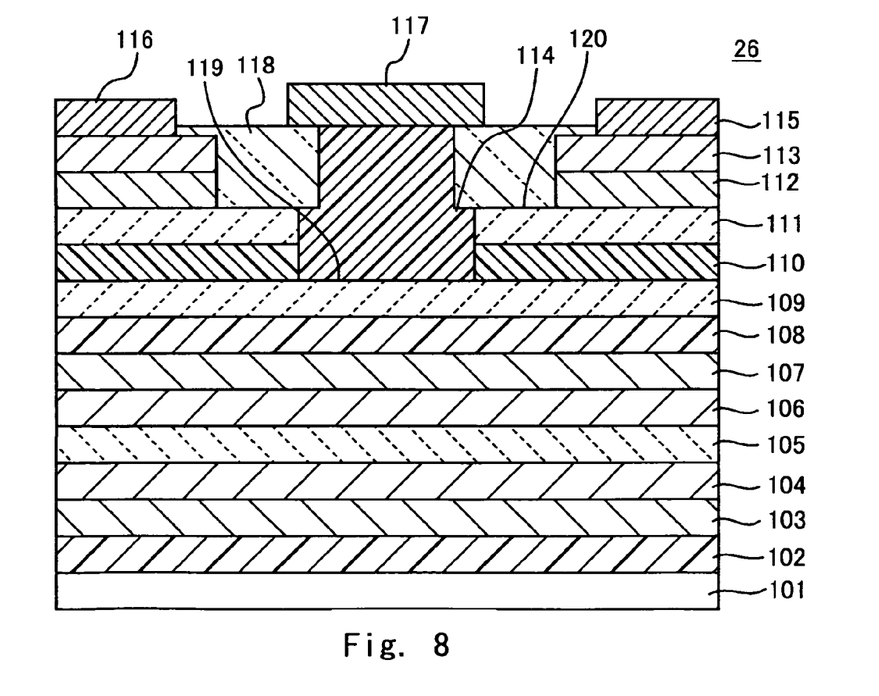
FIG. 8 is a sectional view of a J-FET having a structure where the upper surface of the p$^+$-GaAs layer is flush with the upper surface of a gate insulating film.
Figure 9:
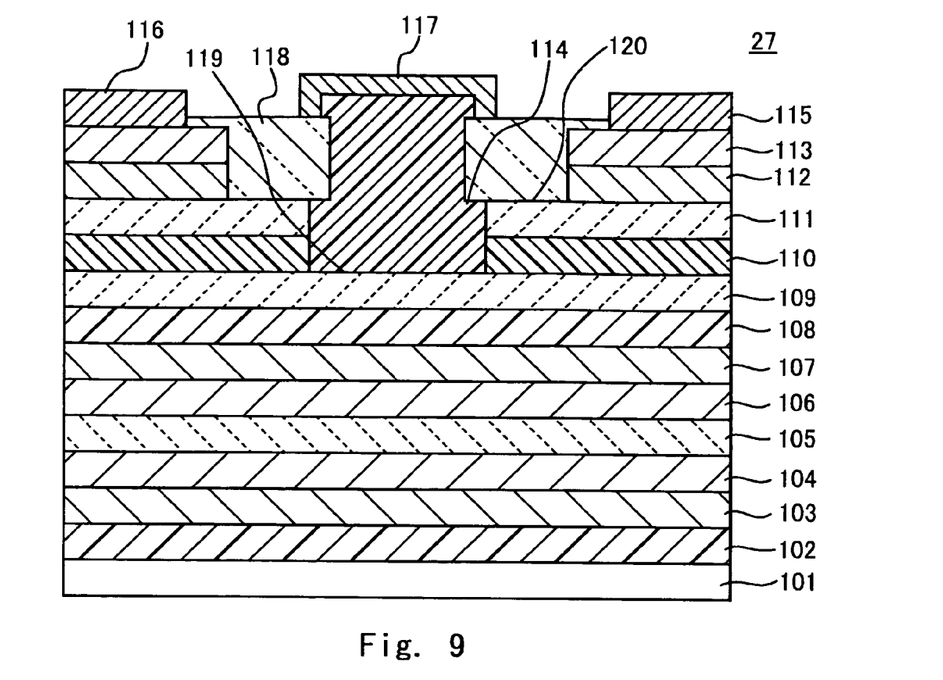
FIG. 9 is a sectional view of a J-FET having a structure where the upper surface of the p$^+$-GaAs layer is higher in position than the upper surface of a gate insulating film.

Incidentally, as shown in FIG. 8, it is possible to use a J-FET 26 structured such that an upper surface of the p$^+$-GaAs layer 114 is flush with an upper surface of the gate insulating film 118. Further, as shown in FIG. 9, it is possible to use a J-FET 27 structured such that the p$^+$-GaAs layer 114 has an upper surface above the upper surface of the gate insulating film 118.

Figure 10:
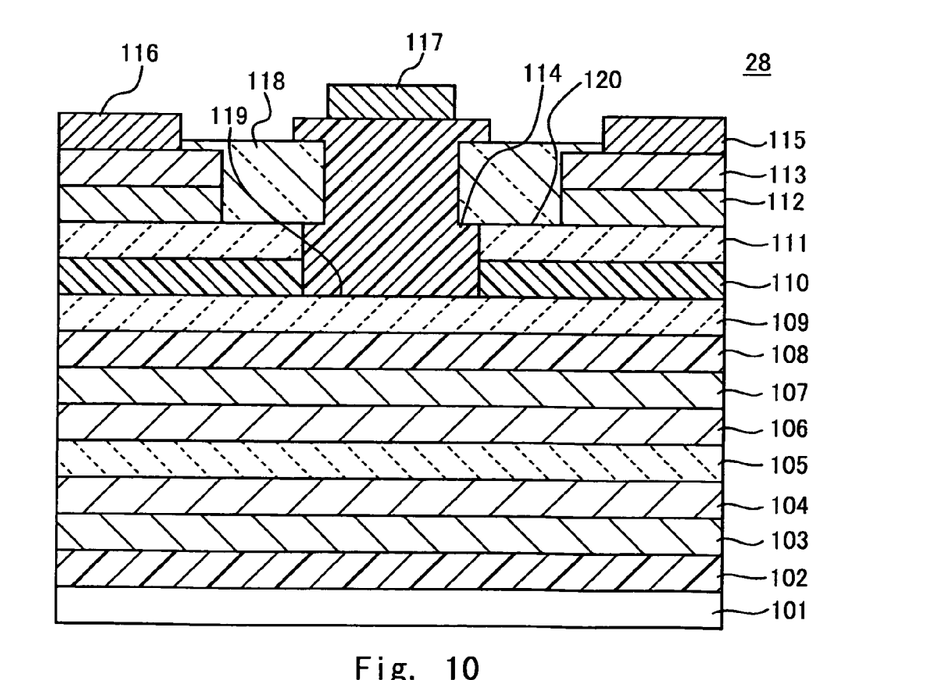
FIG. 10 is a sectional view of a J-FET having a structure where a gate electrode is formed on a part of the exposed surface of the p$^+$-GaAs layer.

Further, if the p$^+$-GaAs layer 114 has an upper surface above an upper surface of the gate insulating film 118, it is possible to use a J-FET 28 where the gate electrode 117 is formed in a part of the exposed surface of the p$^+$-GaAs layer 114 as well as the J-FET 27 where the gate electrode 117 is formed to cover the exposed surface of the p$^+$-GaAs layer 114.

The p$^+$-GaAs layer 114 is doped with C at $1\times10^{20}$ cm$^{-3}$. As an example, C is used as the p-type impurities, or other p-type impurities such as Mg or Zn can be used.

The gate electrode 117 is formed on the p$^+$-GaAs layer 114 buried in the gate recess structure 119. Further, the gate electrode 117 contacts the upper side of the p$^+$-GaAs layer 114 to form a pn junction gate. Furthermore, the gate electrode 117 is made of, for example, WSi. As an example, WSi is used for the gate electrode 117, or other electrode materials such as Pt, Ti, Ni, Al, AuZn, W, Mo, or Cr can be used.

Further, laminated on the undoped GaAs layer 111 are the n$^+$-AlGaAs wide recess stopper layer 112 (for example, with the thickness of 5 nm) and the n$^+$-GaAs cap layer 113 (for example, with the thickness of 100 nm).

Further, the n$^+$-AlGaAs wide recess stopper layer 112 and the n$^+$-GaAs cap layer 113 form the wide recess structure 120. The n$^+$-AlGaAs wide recess stopper layer 112 and the n$^+$-GaAs cap layer 113 are doped with Si at $4\times10^{18}$ cm$^{-3}$ for example. The wide recess structure 120 is formed, making it possible to prevent the contact with C-doped p+-GaAs layer 114.

The wide recess stopper layer 112 can be an n+-InGaP layer doped with Si impurities at $4 \times 10^{13}$ cm³, for example. At this time, the InGaP layer has a lower potential barrier with respect to electrons than the AlGaAs layer, so a contact resistance from the n+-GaAs layer 114 to the InGaAs channel layer 105 is reduced. Therefore, it is possible to attain an on-resistance value of 1.4 Ωmm that is 0.2 Ωmm smaller than that in the case of forming the wide recess stopper layer 112 using n+-AlGaAs.

Further, in the wide recess structure 120, the gate insulating film 118 is buried. In addition, the gate insulating film 118 contacts the n+-AlGaAs wide recess stopper layer 112 and the n+-GaAs cap layer 113 at the side surface of the wide recess structure 120. The gate insulating film 118 can be an $SiO_2$ film, an $SiN_x$ film, or an SiON film as an insulating film.

Further, formed on the n+-GaAs cap layer 113 are the source electrode 116 and the drain electrode 115. The source electrode 116 and the drain electrode 115, and the gate electrode 117 contact the gate insulating film 118. Further, the source electrode 116 and the drain electrode 115 are formed of, for example, an AuGe—Ni—Au alloy layer.

The p-type impurity concentration of the p+-GaAs layer 114 buried into the gate recess structure 119 is desirably higher than the n-type impurity concentration of the n+-AlGaAs electron supply layer 107. If the concentration is equal to or lower than the concentration of the n+-AlGaAs electron supply layer 107, the depletion layer extending in the p+-GaAs layer 114 becomes wider than the depletion layer extending in the n+-AlGaAs electron supply layer 107, so the density of electrons accumulated in the channel layer cannot be changed with the gate voltage.

At this time, the p+-GaAs layer 114 is doped with p-type impurities, and the Fermi level becomes closer to the valence band. Therefore, a potential barrier with respect to electrons in the InGaAs channel layer 105 can be increased up to about 1.4 eV as a band gap of GaAs.

As a result, the barrier can be increased by about 0.4 eV as compared with a general Schottky barrier of 1 eV which results from the contact between the gate electrode and the n-AlGaAs layer or the undoped AlGaAs layer.

Further, the C-doped p+-GaAs layer 114 can be replaced by a C-doped p+-AlGaAs layer. In this case, a band gap of AlGaAs is higher than a band gap of GaAs by about 0.3 eV, so the potential barrier can be increased up to about 1.7 eV.

In the J-FET 10, the thickness of a portion where the p+-GaAs layer 114 contacts the InGaP gate recess stopper layer 110 corresponds to only the thickness of the InGaP gate recess stopper layer 110, so an amount of the indium oxide or InAs semiconductor as a conductive material can be reduced.

Further, even if the indium oxide and InAs semiconductor are formed on the surface of the InGaP gate recess stopper layer 110, the undoped GaAs layer 111 is laminated on the InGaP gate recess stopper layer 110, making it possible to suppress the gate leak current.

In addition, electrons of a part of the InGaP gate recess stopper layer 110 and the undoped GaAs layer 111 that contact the side surface of the p+-GaAs layer 114 are reduced due to the surface depletion layer 121. Based on the above, a path of the leak current is blocked at the interface between the p+-GaAs layer 114 and the InGaP gate recess stopper layer 110.

Figure 11:
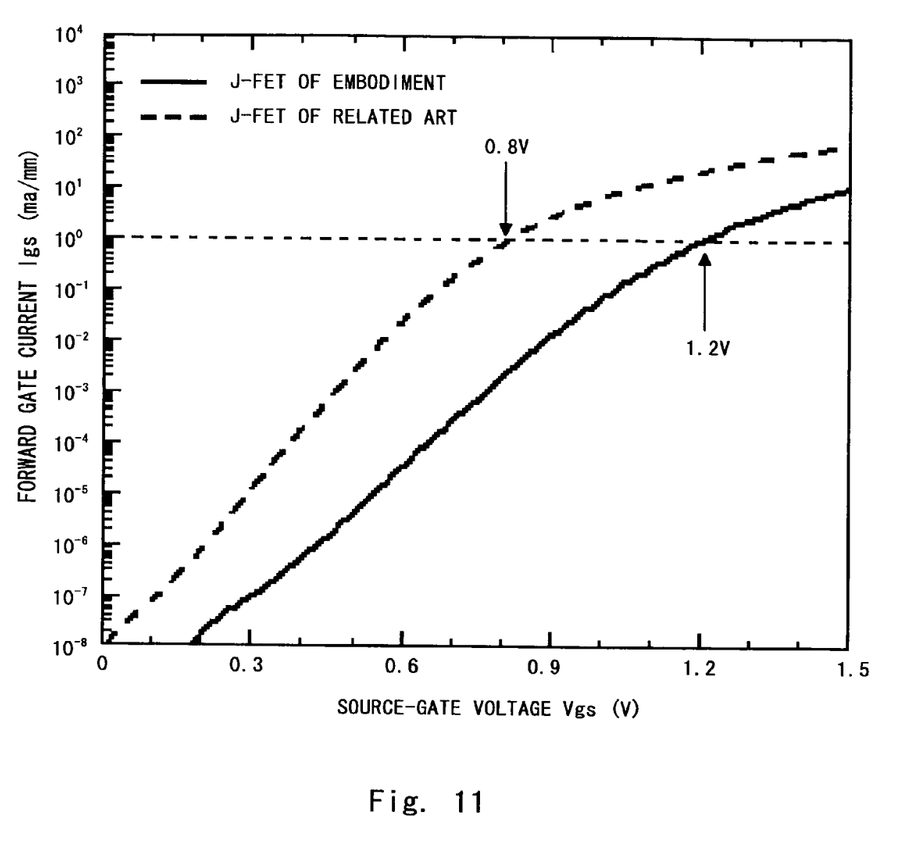
FIG. 11 shows the result of comparing gate forward voltage characteristics of the J-FET of the embodiment of the invention with a J-FET of the Related Art.

FIG. 11 shows gate forward voltage characteristics the J-FET 10 of this embodiment and a J-FET 90 of the Related Art. The vertical axis represents a forward gate current $I_{gs}$, and the horizontal axis represents a gate-source voltage.

In this case, the gate forward turn-on voltage $V_F$ is defined as a gate-source voltage at the forward gate current of 1 mA/mm. As shown in FIG. 11, the $V_F$ of the J-FET 90 of the Related Art is 0.8 V, while the $V_F$ of the J-FET 10 of this embodiment is as high as 1.2 V.

This is because the pn junction is formed just below the gate electrode to thereby attain a high potential barrier and suppress the gate leak current. In the J-FET 10 of this embodiment, because of the high $V_F$, a voltage applied to the gate electrode increases, and the maximum drain current can be increased up to 350 mA/mm to 450 mA/mm.

As described above, in the J-FET 10 of this embodiment, it is possible to suppress a gate leak current that flows through conductive indium oxide or InAs semiconductor with a small band gap, which is formed on the In-contained semiconductor, and to form a J-FET having a high gate forward turn-on voltage $V_F$. As a result, the maximum drain current can be increased.

Further, in the J-FET 10 of this embodiment, a part of the p+-GaAs layer is buried into the gate recess structure, so a resistance of the wide recess region 120 is lowered, with the result that mutual conductance and low on-resistance can be attained.

Incidentally, the above J-FET is a GaAs J-FET that is manufactured using an epitaxial layer that matches in lattice with the semiconductor layer on the GaAs substrate, but the same effects can be attained with an InP J-FET, and a GaN J-FET.

Further, in the above J-FET, n-type carriers are accumulated in the channel layer, and p-type impurities are added to the semiconductor layer having the gate recess structure, but the same effects can be obtained if p-type carries are accumulated in the channel layer, and n-type impurities are added to the semiconductor layer having the gate recess structure.

Further, the channel layer 105 can be replaced by an Si doped GaAs layer. As an example thereof, a 30 nm-thick n+-GaAs layer doped with the Si impurities at $1 \times 10^{18}$ cm⁻³ is used. Moreover, the channel layer 105 can be replaced by an Si doped InGaAs layer. As an example thereof, a 30 nm-thick n+-InGaAs layer doped with Si impurities at $1 \times 10^{18}$ cm⁻³ is used. Further, the channel layer 105 may have the laminate structure of two layers different in n-type impurity concentration. To give an example thereof, a 50 nm-thick n-GaAs layer doped with Si impurities at $5 \times 10^{17}$ cm⁻³ and a 50 nm-thick n⁻-GaAs layer doped with Si impurities at $5 \times 10^{16}$ cm⁻³ are laminated.

It is apparent that the present invention is not limited to the above embodiment that may be modified and changed without departing from the scope and spirit of the invention.

What is claimed is:

1. A field effect transistor, comprising:
   a semiconductor substrate;
   a channel layer of a first conductivity type formed on the semiconductor substrate; and
   a semiconductor layer of a second conductivity type that is buried in a recess structure formed in a semiconductor layer on the channel layer and connected with a gate electrode,
   wherein the recess structure is formed using a recess stopper layer comprising In,
   wherein a semiconductor layer that contacts the bottom of the semiconductor layer of the second conductivity type does not comprise In, and wherein an uppermost semiconductor layer among semiconductor layers that contact a side surface of the semiconductor layer of the second conductivity type does not comprise In, and wherein said recess stopper layer and said uppermost semiconductor layer are undoped.

2. The field effect transistor according to claim 1, wherein a wide recess structure that is wider than the recess structure is formed on the recess structure.

3. The field effect transistor according to claim 2, wherein an insulating layer is buried in the wide recess structure.

4. The field effect transistor according to claim 1, wherein the uppermost semiconductor layer among semiconductor layers that contact a side surface of the semiconductor layer of the second conductivity type comprises a GaAs layer.

5. The field effect transistor according to claim 1, wherein the uppermost semiconductor layer among semiconductor layers that contact a side surface of the semiconductor layer of the second conductivity type comprises an AlGaAs layer.

6. The field effect transistor according to claim 1, wherein an impurity of the semiconductor layer of the second conductivity type comprises C.

7. The field effect transistor according to claim 1, wherein the recess stopper layer comprises an $In_xGa_{1-x}P$ ($0.4 \leq x \leq 0.6$) layer.

8. The field effect transistor according to claim 1, wherein the recess stopper layer comprises an $(Al_xGa_{1-x})_yIn_{1-y}P$ ($0 \leq x \leq 1$, $0.4 \leq y \leq 0.6$) layer.

9. The field effect transistor according to claim 1, wherein the recess stopper layer is comprised of a thickness of 1 nm or more.

10. The field effect transistor according to claim 2, wherein a stopper layer used for forming the wide recess comprises $In_xGa_{1-x}P$ ($0.4 \leq x \leq 0.6$).

11. The field effect transistor according to claim 1, wherein a thickness of the semiconductor layer of the second conductivity type is greater than a combined thickness of the semiconductor layer that contacts the bottom of the semiconductor layer of the second conductivity type and the recess stopper layer.

12. The field effect transistor according to claim 1, wherein the semiconductor layer of the second conductivity type comprises an upper surface flush with an upper surface of a gate insulating film.

13. The field effect transistor according to claim 1, wherein the semiconductor layer of the second type comprises one of a C-doped $p^+$-GaAs layer and a C-doped $p^+$-AlGaAs layer.

14. The field effect transistor according to claim 1, wherein the semiconductor layer of the second conductivity type comprises an upper surface formed above an upper surface of a gate insulating film.

15. The field effect transistor according to claim 14, wherein the gate electrode is formed on the upper surface of the semiconductor layer of the second conductivity type above the upper surface of the gate insulating film.

16. The field effect transistor according to claim 14, wherein the gate electrode covers the upper surface of the semiconductor layer of the second conductivity type above the upper surface of the gate insulating film.

17. A method of manufacturing a field effect transistor comprising:

forming a stack of semiconductor layers comprising a semi-insulative substrate, a buffer layer, a channel layer interposed between upper and lower electron supply layers, an undoped AlGaAs layer, gate recess stopper layer comprising In formed on a top surface of a layer not comprising In, and an uppermost semiconductor layer that does not comprise In;

forming a gate recess structure comprising a first recess in the uppermost semiconductor layer and a second recess in the gate recess stopper layer by using portions of the uppermost semiconductor layer as mask;

forming in the gate recess structure a p-type semiconductor layer comprising a bottom surface of the p-type semiconductor layer contacting said top surface of the layer not comprising In, left and right surface of the p-type semiconductor layer contacting the portions of the uppermost semiconductor layer used as mask, and a top surface of the p-type semiconductor layer contacting a gate electrode; and forming a wide recess structure on the portions of the uppermost semiconductor layer used as mask, the wide recess structure comprising two sides formed by an etched wide recess stopper layer and an etched cap layer, the wide recess structure comprising gate insulating film placed between the two sides and surrounding the p-type semiconductor, the etched cap layer comprising two top surfaces where a source and drain electrode are formed, wherein said state recess stopper layer and said uppermost semiconductor layer are undoped.

18. The method of manufacturing according to claim 17, wherein the uppermost semiconductor layer comprises impurities.

19. The method of manufacturing according to claim 17, wherein the p-type semiconductor layer comprises a p-type impurity concentration greater than n-type impurity concentration of the upper electron supply layer.

20. A field effect transistor comprising:

a stack of semiconductor layers comprising a semi-insulative substrate, a buffer layer, a channel layer interposed between an upper and lower electron supply layers, an undoped AlGaAs layer, a gate recess stopper layer comprising In formed on a top surface of a layer not comprising In, and an uppermost semiconductor layer that does not comprise In, a gate recess structure comprising a first recess in the uppermost semiconductor layer and a second recess in the gate recess stopper layer;

a p-type semiconductor layer formed in the gate recess structure and comprising a bottom surface of the p-type semiconductor layer contacting said top surface of the layer not comprising In, left and right surface of the p-type semiconductor layer contacting the portions of the uppermost semiconductor layer, and a top surface of the p-type semiconductor layer contacting a gate electrode; and a wide recess structure on the portions of the uppermost semiconductor layer, the wide recess structure comprising two sides formed by an etched wide recess stopper layer and an etched cap layer, the wide recess structure comprising gate insulating film placed between the two sides and surrounding the p-type semiconductor, the etched cap layer comprising two top surfaces where a source and drain electrode are formed, wherein said gate recess stopper layer and said uppermost semiconductor layer are undoped.

* * * * *